United States Patent [19]

Ohtsuka et al.

[11] Patent Number: 4,824,254
[45] Date of Patent: Apr. 25, 1989

[54] ALIGNMENT MARKS ON SEMICONDUCTOR WAFERS AND METHOD OF MANUFACTURING THE MARKS

[75] Inventors: Hiroshi Ohtsuka; Yoshio Itoh; Tadashi Nishimuro, all of Tokyo; Hisamitsu Mitsutomi, Miyazaki, all of Japan

[73] Assignee: Oki Electric Industry Co., Ltd., Tokyo, Japan

[21] Appl. No.: 612,023

[22] Filed: May 18, 1984

[30] Foreign Application Priority Data

May 20, 1983 [JP] Japan ................................. 58-87542

[51] Int. Cl.$^4$ ............................................. G01B 11/00
[52] U.S. Cl. .................................................. 356/401
[58] Field of Search ............... 356/399, 400, 401, 363; 250/557

[56] References Cited

U.S. PATENT DOCUMENTS

| 4,309,813 | 1/1982 | Hull | 356/401 |
| 4,356,223 | 10/1982 | Iida et al. | 356/401 |
| 4,419,013 | 12/1983 | Heimer | 356/401 |

Primary Examiner—R. A. Rosenberger
Attorney, Agent, or Firm—Wenderoth, Lind & Ponack

[57] ABSTRACT

Alignment marks on a semiconductor wafer comprise a first alignment island projecting from a surface of the wafer and a second alignment island having substantially the same height as the first alignment island and surrounding the same with a slit therebetween. The slit is utilized as a pattern for aligning with an alignment mark on a photomask. Preferably the alignment marks are formed on the grid line region of the wafer.

3 Claims, 10 Drawing Sheets

FIG_1  PRIOR ART
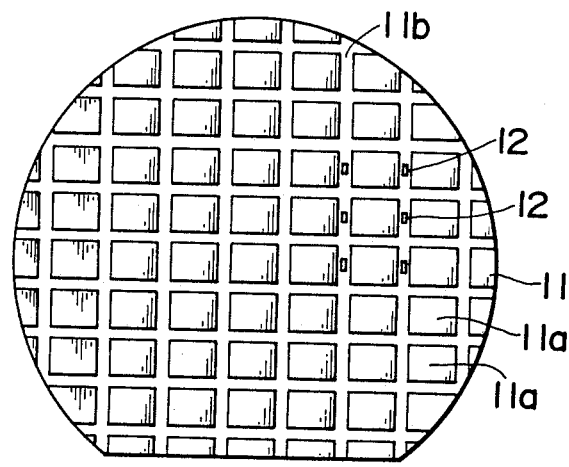
FIG_2  PRIOR ART
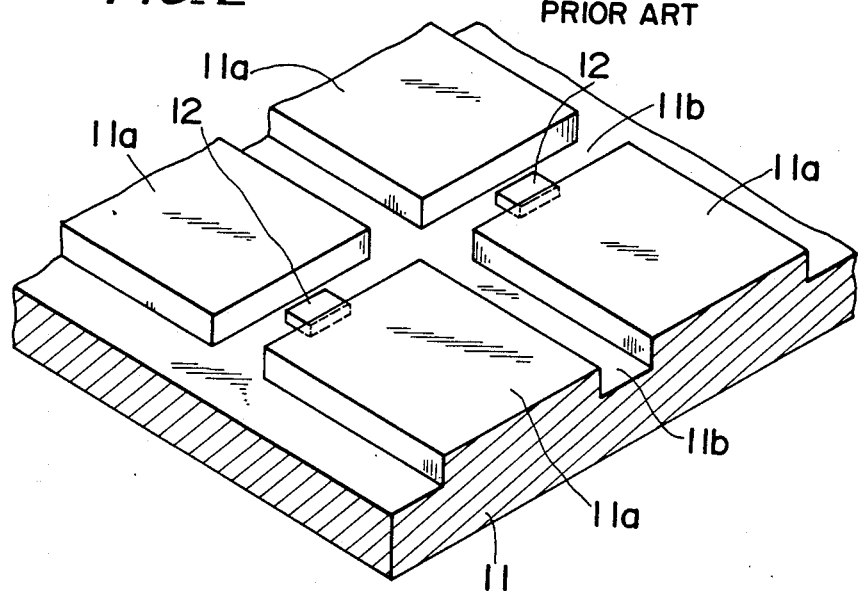

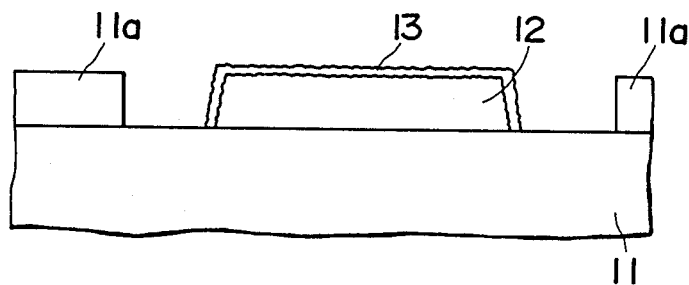
FIG_3 PRIOR ART
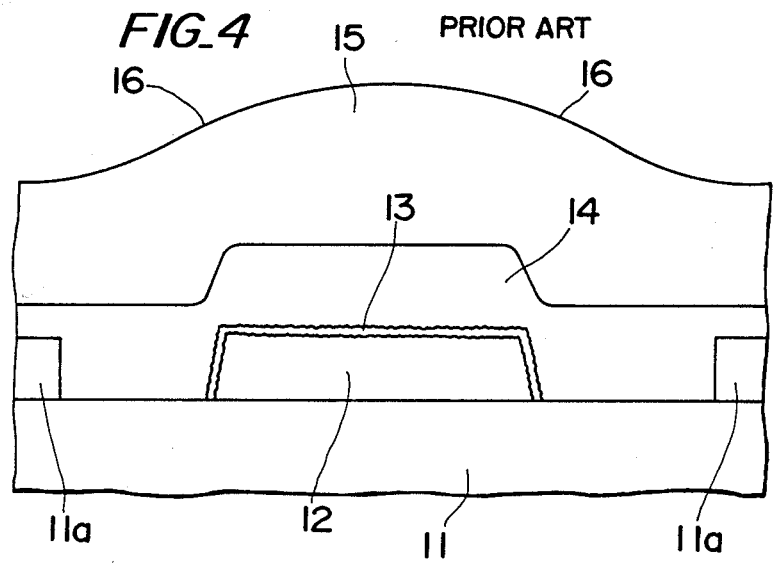
FIG_4 PRIOR ART

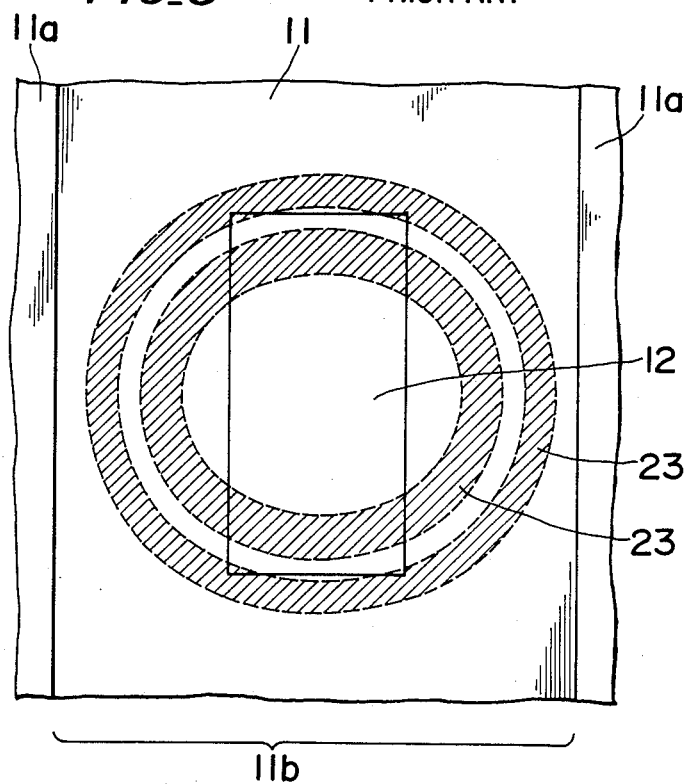
FIG_5  PRIOR ART

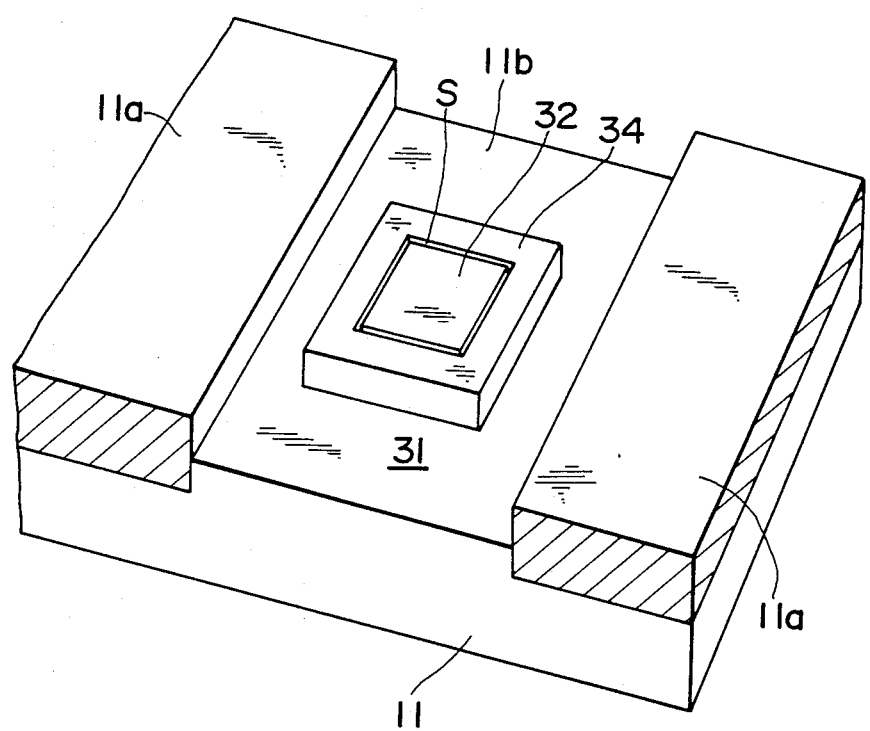
FIG_6

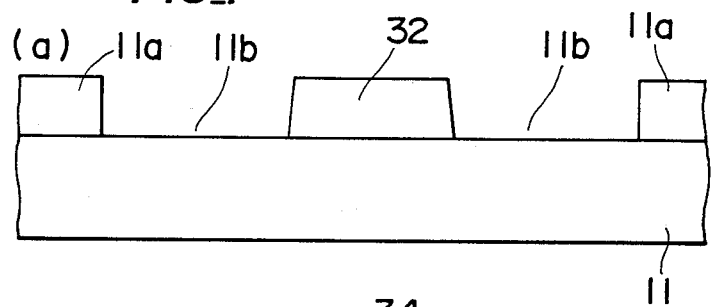
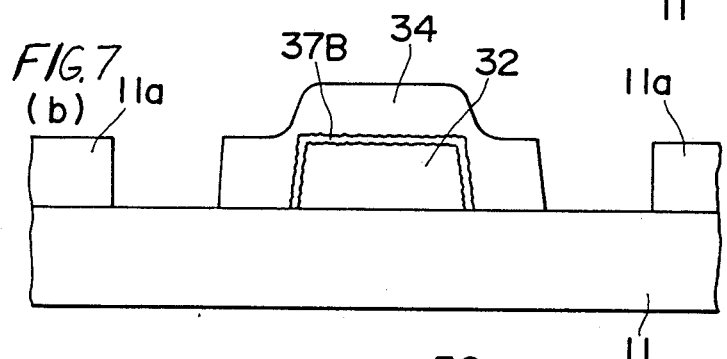
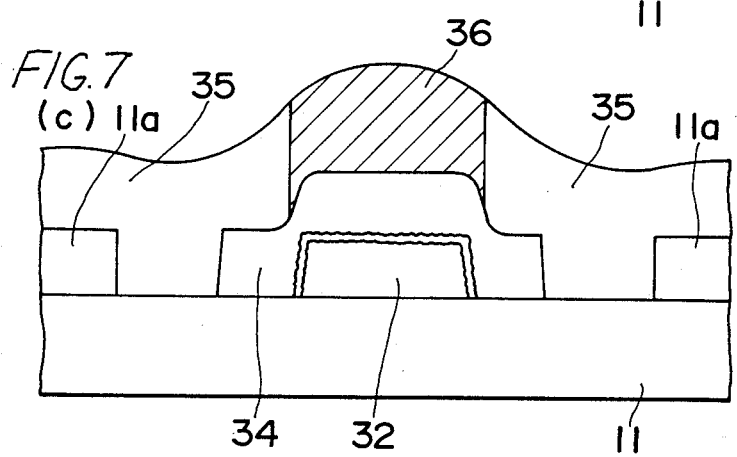

FIG. 7
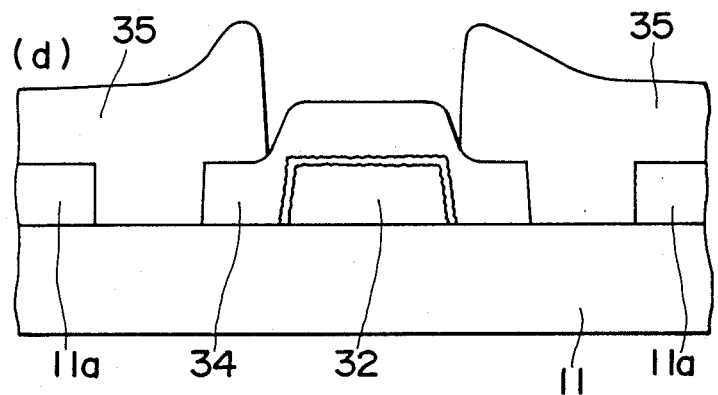
(d)
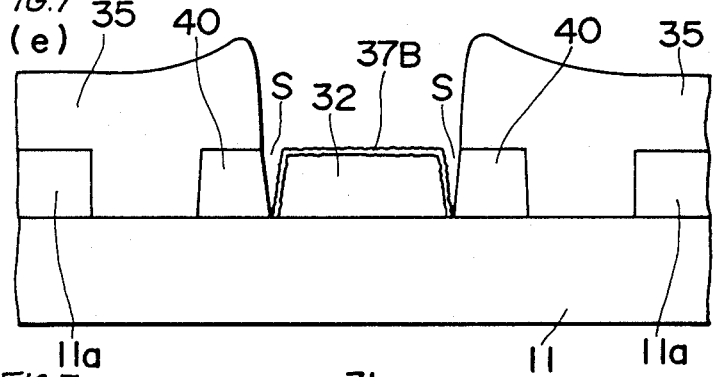
(e)
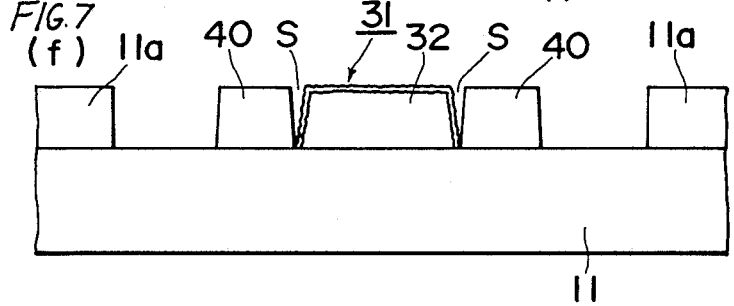
(f)

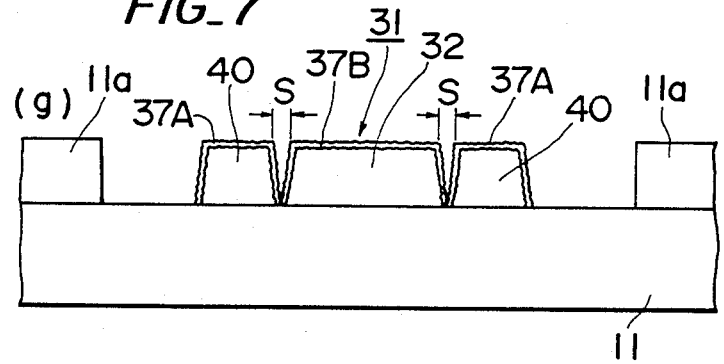
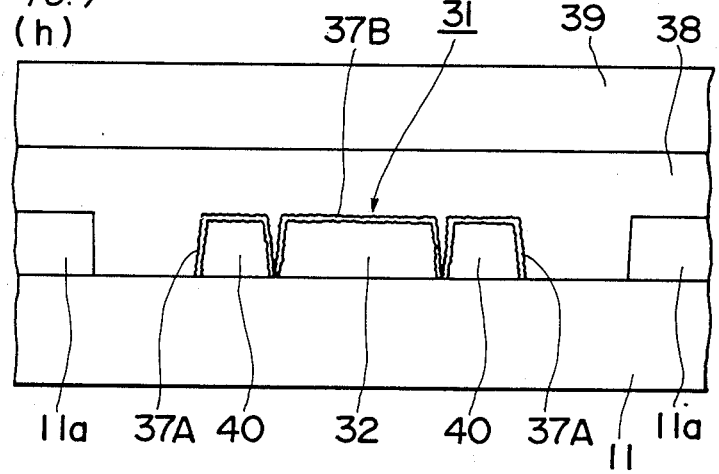

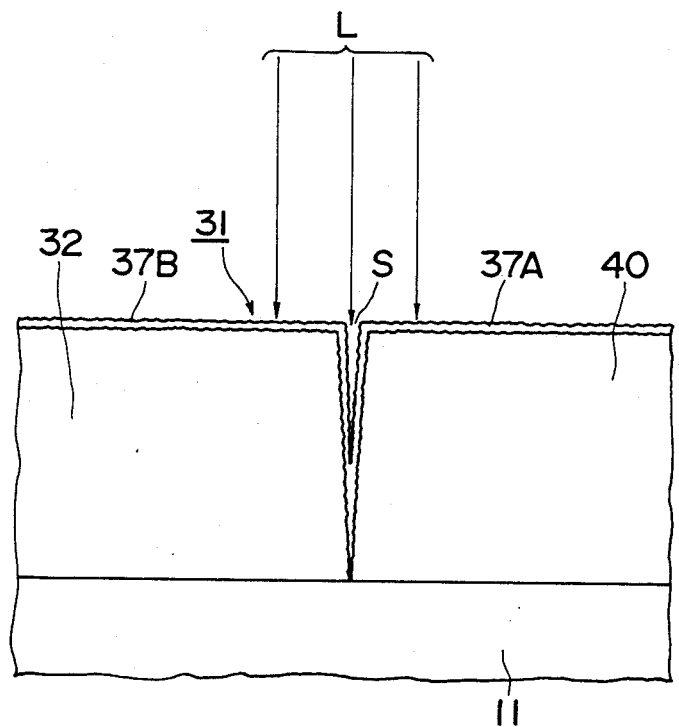
FIG_8

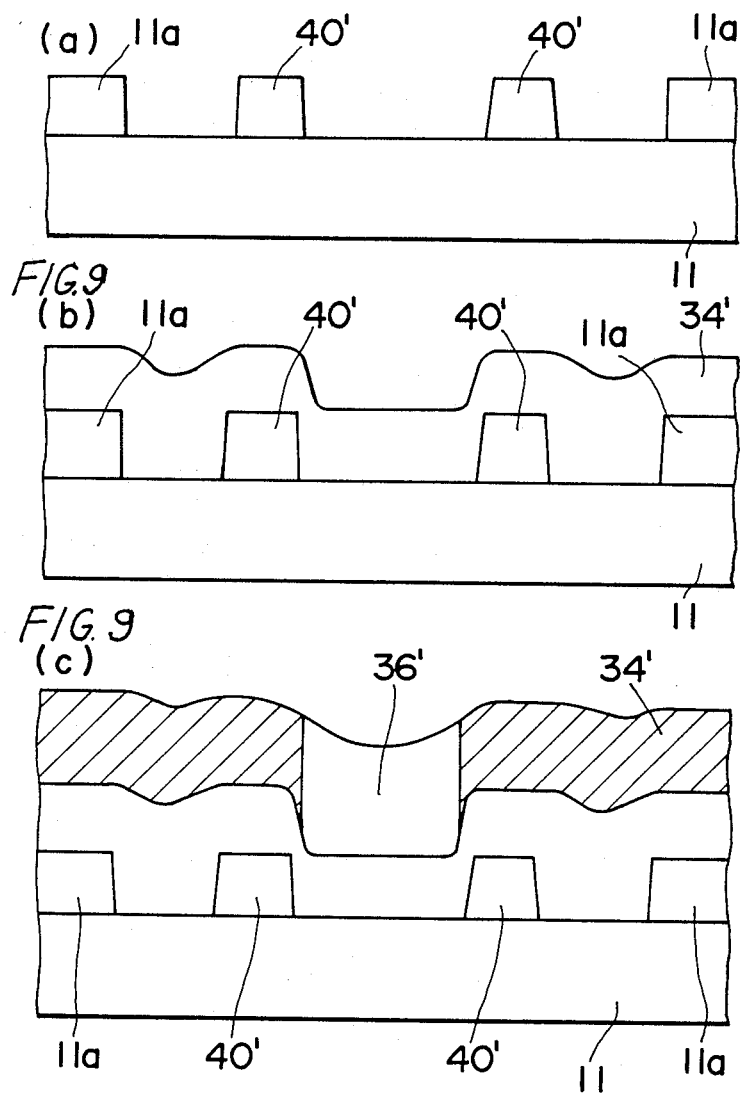

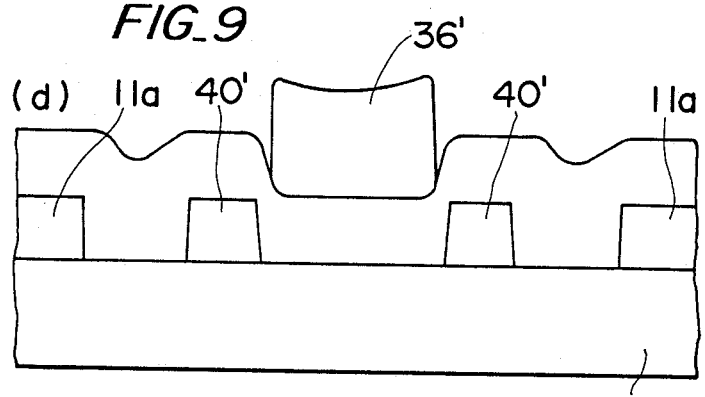
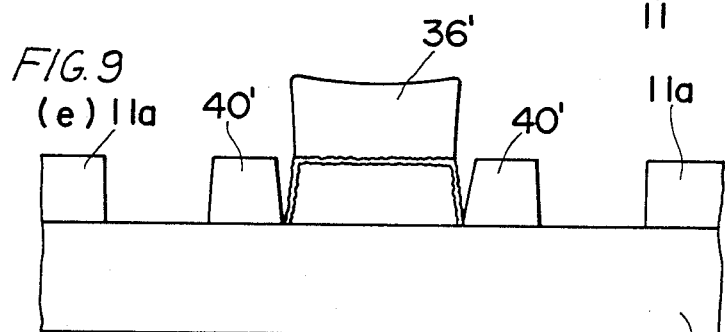
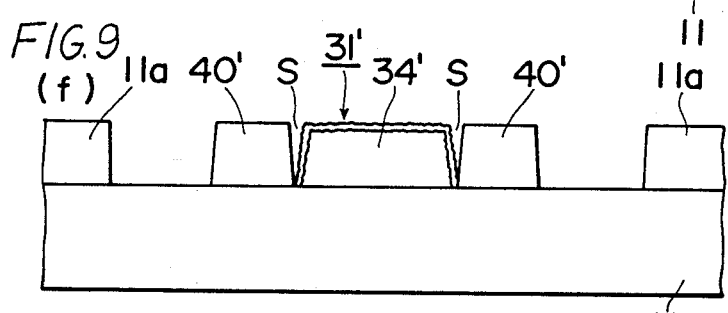
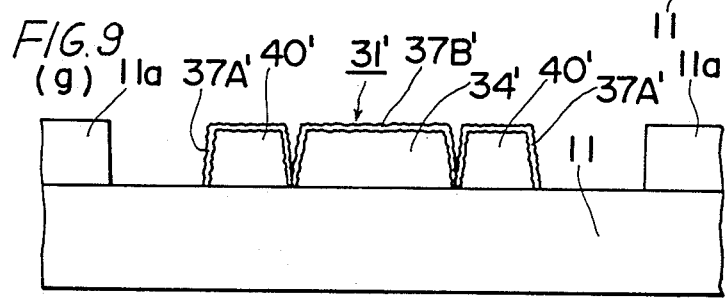

4,824,254

ALIGNMENT MARKS ON SEMICONDUCTOR WAFERS AND METHOD OF MANUFACTURING THE MARKS

BACKGROUND OF THE INVENTION

This invention relates to alignment marks on a semiconductor wafer which can provide good visibility, and a method of manufacturing the alignment marks.

In IC wafer processes, a photolithographic technique is very important to manufacture semiconductor integrated circuit devices, and includes the steps of placing a photomask over a semiconductor wafer, and aligning the alignment mark on the photomask with a corresponding alignment mark on the semiconductor wafer. Prior art positive type alignment marks for a semiconductor wafer are shown in FIGS. 1, 2 and 3. In these figures, reference numeral 11 designates a silicon substrate, and 11a designates chip regions divided by grid line regions 11b. Alignment marks 12, for example, are formed of polycrystalline silicon having a thickness of 1000–5000 Å and are placed on the grid line regions 11b on the silicon substrate 11. Since the alignment marks 12 are subjected several times to a temperature of 600°–1300° C., oxide films having rough surfaces with a roughness of 300–600 Å are necessarily formed on the alignment marks 12.

As shown in FIG. 4, to form phospho-silicate glass (PSG) film 14 having a thickness of 600–1000 Å on the substrate 11, a photo resist film 15 having a thickness of 5000–20000 Å is applied on the PSG film 14.

In automated alignment and exposure apparatus, the alignment is carried out by detecting light reflected from the surface of a semiconductor wafer, and then by placing the edge on an alignment mark 12 in coincidence with the end of a corresponding alignment mark on a photomask (not shown). Then, IC patterns on the photomask are copied on the surface of the photo resist film 15 by exposing the surface of the resist film 15 to ultraviolet light. However, since the surface of the photo resist film 15 on the edge of the alignment mark 12 is sloped, ring-shaped interference patterns 23 are observed in the scope of a microscope or an edge detector of the automated apparatus. (See FIG. 5) This interference pattern makes it difficult for a viewer to exactly align the alignment mark on a semiconductor wafer with the corresponding alignment mark on a photomask. Particularly, an automated alignment and exposure apparatus takes a long time to detect and align the edge of an alignment mark on a semiconductor wafer, so that it is difficult to carry out photolithographic processes without detection error, causing degradation of yields of IC devices having extremely fine structures. Furthermore, such an automated alignment and exposure apparatus has degraded the workability and efficiency of photolithographic process.

SUMMARY OF THE INVENTION

Accordingly, it is an object of this invention to provide an improved alignment mark and method of manufacturing the same.

According to one aspect of this invention, there are provided alignment marks on a semiconductor wafer comprising a first alignment island projecting from a surface of the semiconductor wafer, and a second alignment island having substantially the same height as the first alignment island and surrounding the same but with a slit therebetween, the slit being utilized as a pattern for aligning with an alignment mark on a photomask.

According to another aspect of this invention, there is provided a method of manufacturing alignment marks on a semiconductor wafer comprising the steps of forming a first island on a surface of the semiconductor wafer, forming a film acting on the substrate to cover and surround the first alignment island, the first alignment island and said film having substantially the same thickness, coating a photo resist film on the film and the first alignment island, exposing the resist over said first island to light to develop said resist, etching the film of the first island so as to form a narrow slit between the first alignment island and the wretched portion of the film acting as a second alignment island and removing the resist film.

According to a modified method, a second enclosing alignment island is formed first and the first alignment island is formed within the second alignment island with a narrow slit therebetween.

BRIEF DESCRIPTION OF THE DRAWINGS

In the accompanying drawings:

FIG. 1 is a plan view showing a prior art semiconductor wafer;

FIG. 2 is an enlarged perspective view of a portion of the semiconductor wafer showing prior art alignment marks;

FIGS. 3 and 4 are sectional views showing a prior art method of forming an alignment mark;

FIG. 5 is a plan view showing an alignment mark formed by the method shown in FIGS. 3 and 4 as viewed through a scope;

FIG. 6 is an enlarged perspective view showing an alignment mark according to the invention;

FIGS. 7a through 7h are sectional views showing successive steps of forming alignment marks according to one embodiment of the method of this invention;

FIG. 8 is an enlarged sectional view showing a slit portion of the alignment marks according to this invention;

FIGS. 9a through 9g are sectional views showing successive steps of forming alignment marks according to a modified method of this invention.

DESCRIPTION OF THE PREFERRED EMBODIMENT

The invention is characterized in that the detection regions of an alignment mark are not stepped. As will be described in more detail with reference to FIG. 6, the alignment mark 3 comprises a first pattern or island 32 and a second island 34 surrounding the same and separated therefrom by a slit having a width of about 1μ, both islands 32 and 34 being formed by different steps on the grid line region 11b shown in FIG. 1. As will be described later, either one of the islands can be formed first and then the other is formed. However, it is essential to form both islands so that they have substantially the same height or thickness and to form a narrow slit therebetween.

A method of preparing the alignment mark shown in FIG. 6 will now be described with reference to FIGS. 7a through 7h. At first, as shown in FIG. 7a a projecting first alignment island 32 is formed on the grid line region 11b of a wafer substrate 11 (SiO₂, Si substrate or the like). 11a designates a chip region.

Then as shown in FIG. 7b, a film 34 usually made of polycrystalline silicon or PSG film having a thickness of 3000–5000 Å is grown so as to cover the substrate 11 and the alignment island 32, the lower portion of the film 34 surrounding the periphery of the first alignment island 32 with a spacing of about 1.0 micron.

Then as shown in FIG. 7c, a photo resist film 35 is coated on the film 34 and a portion 36 of the resist film 35 having a size about 1μ larger than the diameter of the first alignment island 32 is exposed to light by a conventional photolithographic process.

Thereafter, as shown in FIG. 7d, the exposed portion 36 on the film 34 is removed.

Then as shown in FIG. 7e, the exposed resist film 35 is used as a mask for etching the portion of the film 34 not covered by the mask. By this etching, the second alignment island 40 surrounding the first alignment island 32 is provided and a narrow slit S is left therebetween.

After that as shown in FIG. 7f, the resist film 35 is removed, whereby the alignment mark 31 has a narrow slit S formed between the first and second islands 32 and 40.

Subsequent to the photolithographic etching, as shown in FIG. 7g, the assembly is heat treated to form an oxide film 37B having a thickness of about 300–600 Å on the first alignment island 32 and film 37A on the second alignment island 40 made from the film 34.

Thereafter, as shown in FIG. 7h, a film 38 (a PSG film having a thickness of 6000 Å–10000 Å) is formed, and then a resist film 39 having a thickness of 5000–20000 Å is formed thereon. This film 38 is subjected to a subsequent photolithographic process, after aligning the slit pattern of the alignment mark 31 with a corresponding alignment mark on a photomask. Thereafter, an IC pattern is defined on the surface of the substrate 11 by selectively etching the film 38.

In this embodiment, since the projecting first alignment island 32 and the second alignment island 40 surrounding the same have substantially the same thickness, their upper surfaces are in the same plane. In other words, there is no step between them. Accordingly, there is no inclined portion in the resist film coated on the alignment island as in the prior art. Thus, no interference of light caused by small variation in the thickness of the resist film shown in FIG. 2 occurs, thereby greatly improving the visibility of the edge of the alignment mark.

Where the light path L for detecting the alignment mark is as shown in FIG. 8, since the grains of the polycrystalline silicon are roughened by the heat treatment, the light entering into the slit undergoes random reflection, so that the light attenuates greatly. As a consequence, although portions of the mark other than the slit reflect the light well, the slit appears as a black line causing a sharp contrast for a viewer, whereby the visibility of the alignment mark is greatly improved.

Due to the advantageous effect described above, the alignment accuracy of the alignment mark of this invention is much higher than a prior art wafer alignment mark having a projecting or recessed configuration.

Although in the foregoing embodiment a projecting first alignment island was formed first and then a second alignment island was formed to surround the same with a slit therebetween, in the second embodiment shown in FIGS. 9a and 9g, a second enclosing alignment island 40' is formed first as shown in FIG. 9a and then a film 34' is superposed thereon as shown in FIG. 9b to form the first alignment island. The succeeding steps shown in FIGS. 9c–9g are identical to FIGS. 7c–7g so that corresponding portions are shown by the same reference numerals with primes.

As above described, the alignment marks of this invention comprise a first alignment island projecting from a surface of a semiconductor wafer, and a second alignment island having substantially the same height as the first alignment island and surrounding the same with a slit therebetween, the slit being utilized as a pattern for aligning with an alignment mark on a photomask, so that due to attenuation of light, the slit has a high contrast with respect to other portions, thus increasing visibility and improving the accuracy of detecting the aligning mark. The alignment marks of this invention can readily be formed by merely forming the first and second alignment islands on a semiconductor wafer without improving an aligner, wafer processing and method of alignment utilized in the prior art, and the method of this invention can be applied to all alignment methods including the reduced projection method and the reflection projection method.

We claim:

1. An alignment mark on a semiconductor wafer, comprising:
   a first alignment island of phospho-silicate glass projecting from a surface of said wafer; and
   a second alignment island of polycrystalline silicon having substantially the same height as said first alignment island and surrounding said first alignment island and spaced therefrom to form a slit having a rectangular or square form therebetween, said slit having a width of no more than about 1 micron,
   the opposed surfaces of said islands defining said slit therebetween being roughened for attenuation, through random reflection, light entering said slit, whereby when said slit is utilized as a pattern for aligning with an alignment mark on a photomask, said slit is observed as a clear black line.

2. An alignment mark according to claim 1 wherein said first and second alignment islands are each 3000 through 5000 angstroms in thickness.

3. An alignment mark according to claim 1 wherein said alignment mark is in a grid line on said semiconductor wafer.

* * * * *